United States Patent
Lin et al.

(10) Patent No.: US 10,043,850 B2
(45) Date of Patent: Aug. 7, 2018

(54) HV-LED MODULE HAVING 3D LIGHT-EMITTING STRUCTURE AND MANUFACTURING METHOD THEREOF

(71) Applicant: Xiamen Changelight Co., Ltd., Xiamen (CN)

(72) Inventors: Zhiwei Lin, Xiamen (CN); Kaixuan Chen, Xiamen (CN); Yong Zhang, Xiamen (CN); Xiangjing Zhuo, Xiamen (CN); Wei Jiang, Xiamen (CN); Tianzu Fang, Xiamen (CN); Yinqiao Zhang, Xiamen (CN); Xiangwu Wang, Xiamen (CN)

(73) Assignee: Xiamen Changelight Co., Ltd., Xiamen (CN)

( * ) Notice: Subject to any disclaimer, the term of this patent is extended or adjusted under 35 U.S.C. 154(b) by 179 days.

(21) Appl. No.: 15/073,656

(22) Filed: Mar. 18, 2016

(65) Prior Publication Data
US 2016/0276402 A1    Sep. 22, 2016

(30) Foreign Application Priority Data

Mar. 20, 2015  (CN) .......................... 2015 1 0122251
Mar. 20, 2015  (CN) .......................... 2015 1 0122849

(51) Int. Cl.
| | | |
|---|---|---|
| H01L 27/15 | (2006.01) | |
| H01L 33/42 | (2010.01) | |
| H01L 33/30 | (2010.01) | |
| H01L 33/00 | (2010.01) | |
| H01L 33/32 | (2010.01) | |
| H01L 25/075 | (2006.01) | |
| H01L 33/38 | (2010.01) | |

(52) U.S. Cl.
CPC ........ *H01L 27/153* (2013.01); *H01L 25/0756* (2013.01); *H01L 33/0062* (2013.01); *H01L 33/0075* (2013.01); *H01L 33/32* (2013.01); *H01L 33/30* (2013.01); *H01L 33/382* (2013.01); *H01L 33/42* (2013.01); *H01L 2933/0016* (2013.01)

(58) Field of Classification Search
CPC ............... H01L 25/0756; H01L 27/153; H01L 2933/0016; H01L 33/0062; H01L 33/0075; H01L 33/30; H01L 33/32; H01L 33/382; H01L 33/42
See application file for complete search history.

(56) References Cited

U.S. PATENT DOCUMENTS

| | | | | |
|---|---|---|---|---|
| 2011/0006312 A1* | 1/2011 | Hsu | ........................ | H01L 25/167 257/88 |
| 2013/0292718 A1* | 11/2013 | Chu | ...................... | H01L 27/153 257/93 |

* cited by examiner

*Primary Examiner* — Lynne Gurley
*Assistant Examiner* — Ernest Allen, III
(74) *Attorney, Agent, or Firm* — Foley & Lardner LLP; Cliff Z. Liu; Yiming Zhang

(57) ABSTRACT

An HV-LED module having 3D light-emitting structure and a method for manufacturing the HV-LED module are disclosed. The HV-LED module has at least two stacked parts of substage LEDs that each have an independent light-emitting structure and are bonded in a staggered pattern, and the substage LEDs are connected in series to form the 3D light-emitting structure, thereby significantly increasing light-emitting power per unit area, downsizing a high-voltage chip module using it by nearly two times, and effectively reducing packaging costs for the HV-LED module.

15 Claims, 7 Drawing Sheets

HV-LED MODULE HAVING 3D LIGHT-EMITTING STRUCTURE AND MANUFACTURING METHOD THEREOF

BACKGROUND OF THE INVENTION

1. Technical Field

The present invention relates to light-emitting diodes, and more particularly to an HV-LED module having 3D light-emitting structure and a method for manufacturing the same.

2. Description of Related Art

High-voltage light-emitting diode (HV-LED) modules are known to be economical solutions for LED illumination and have two major advantages. First, HV-LED can effectively reduce cost and weight of an LED lamp. Second, HV-LED has significantly reduced requirements for heat dissipation, thereby unlatching LED applications from limitations related to heat dissipation.

HV-LED modules feature for high-voltage and small-current operation and superior and are deemed superior to traditional LED modules that work in a low-voltage and high-current condition. With system-on-package (SOP) using HV-LED, LED lamps are less heated and thus require less from heat dissipation design, while having a light-emitting angle greater than 270 degrees. In addition to low cost and light weight, HV-LED modules also benefit from its ability to perform well with merely only a high-voltage linear constant current source (CCS). Since HV linear CCS requires no transformer and electrolytic capacitor, HV-LED modules are free from the problems relates to driving power and electrolytic capacitor that limit the service life of traditional LED modules.

However, the existing HV-LED technology needs to be improved in terms of light-emitting power and packaging cost. The present invention is therefore created.

SUMMARY OF THE INVENTION

The objective of the present invention is to provide an HV-LED module having 3D light-emitting structure and a method for manufacturing the same with the attempt to improve light-emitting power and reducing packaging costs.

For achieving the foregoing objective, the present invention implements the following scheme:

An HV-LED module having 3D light-emitting structure includes at least two stacked parts substage LEDs that are staggered and bonded to each other. One of the layers has n+1 substage LEDs and is defined as a lower part. The substage LEDs in the lower part are all coplanar. The other layer has n substage LED and is defined as an upper part. The substage LEDs in the upper part are all coplanar. The substage LEDs in the lower part and the substage LEDs in the upper part that are adjacent are at two different planes. Each of the substage LEDs has an independent light-emitting structure, and the substage LEDs are connected in series.

Each of the substage LED has an independent, epitaxial light-emitting structure. Each two independent, epitaxial light-emitting structures are separated by an epitaxial insulating layer. The epitaxial light-emitting structure includes an active layer. The active layer has a first contact surface on which a first-type electric-conducting layer is provided. The active layer has a $2^{nd}$ contact surface on which a second-type electric-conducting layer is provided.

Each of the substage LEDs in the lower part has its substrate provided with a first-type electric-conducting layer. On the first-type electric-conducting layer, a $1^{st}$ electrode is provided. On the second-type electric-conducting layer, a $2^{nd}$ current-spreading electric-conducting layer is provided. On the $2^{nd}$ current-spreading electric-conducting layer, a $2^{nd}$ electrode is provided. The $1^{st}$ electrode and the $2^{nd}$ electrode are at the same side.

Each of the substage LEDs in the upper part has its first-type electric-conducting layer provided with a $1^{st}$ electrode. On the $2^{nd}$-type electric-conducting layer, a $2^{nd}$ current-spreading electric-conducting layer is provided. On the $2^{nd}$ current-spreading electric-conducting layer, a $2^{nd}$ electrode is provided. The $1^{st}$ electrode and the $2^{nd}$ electrode are at the same side.

A non-conductive bonding layer is provided between the adjacent contact surfaces of the substage LEDs in the upper part and of the substage LEDs in the lower part.

The $1^{st}$ electrode of the $1^{st}$ substage LED in the lower part and the $2^{nd}$ electrode of the $1^{st}$ substage LED in the upper part are conductively connected to each other.

The $1^{st}$ electrode of the $1^{st}$ substage LED in the upper part and the $2^{nd}$ electrode of the $2^{nd}$ substage LED in the lower part are conductively connected to each other. The $1^{st}$ electrode of the $2^{nd}$ substage LED in the lower part and the $2^{nd}$ electrode of the $2^{nd}$ substage LED in the upper part are conductively connected. The remaining substage LEDs are such connected successively till the $n^{th}$ substage LEDs in the upper part and in the lower part.

The $1^{st}$ electrode of the $n^{th}$ substage LED in the upper part and the $2^{nd}$ electrode of the $n+1^{th}$ substage LED in the lower part are conductively connected. The $1^{st}$ electrode of the $n+1^{th}$ substage LED in the lower part and the $2^{nd}$ electrode of the $1^{st}$ substage LED in the lower part are soldering-station electrodes.

A method for manufacturing an HV-LED module having a 3D light-emitting structure as claimed in claim 1, being characterized in comprising the following steps:

1) building a buffering layer, a stripping layer, a first-type electric-conducting layer, an active layer and a second-type electric-conducting layer successively on an upper surface of an epitaxial base from bottom to top;

2) as a preparation for making substage LEDs of a lower part, depositing a transparent, electrically conductive material on the second-type electric-conducting layer by means of evaporation process, so as to form a $2^{nd}$ current-spreading electric-conducting layer;

3) forming epitaxial separating troughs on the $2^{nd}$ current-spreading electric-conducting layer by means of masking and ICP etching, wherein said etching is done till the epitaxial base so as to form independent, epitaxial light-emitting structures;

4) forming $1^{st}$-electrode making areas on the $2^{nd}$ current-spreading electric-conducting layer by means of masking and ICP etching, wherein said etching is done till the first-type electric-conducting layer;

5) forming $1^{st}$ electrodes in the $1^{st}$-electrode making areas of the first-type electric-conducting layer, wherein each said $1^{st}$ electrode and the corresponding epitaxial light-emitting structure are separated by an electrode separating trough;

6) forming $2^{nd}$ electrodes on the $2^{nd}$ current-spreading electric-conducting layer, wherein the $1^{st}$ electrodes and the $2^{nd}$ electrodes are at an identical side, and the $1^{st}$ electrodes and the $2^{nd}$ electrodes have surfaces thereof coplanar;

7) filling the epitaxial separating troughs and the electrode separating troughs with an insulating material by means of evaporation process so as to form epitaxial insulating layers and an electrode insulating layers, with the epitaxial separating troughs surrounding the substage LEDs to be later used as cutting streets for the HV-LED module left unfilled, thereby forming the substage LEDs in the lower part;

8) repeating Steps 1 through 7 to make substage LEDs for an upper part;

9) bonding the $1^{st}$ substage LED in the lower part and the $1^{st}$ substage LED in the upper part by: conductively connecting the $1^{st}$ electrode of the $1^{st}$ substage LED in the lower part to the $2^{nd}$ electrode of the $1^{st}$ substage LED in the upper part; and bonding the $2^{nd}$ current-spreading electric-conducting layer of the $1^{st}$ substage LED in the lower part to the $2^{nd}$ current-spreading electric-conducting layer of the $1^{st}$ substage LED in the upper part using a non-electrically-conductive bonding material, thereby forming a non-conductive bonding layer;

10) bonding the $1^{st}$ substage LED in the upper part and the $2^{nd}$ substage LED in the lower part by: conductively connecting the $1^{st}$ electrode of the $1^{st}$ substage LED in the upper part to the $2^{nd}$ electrode of the $2^{nd}$ substage LED in the lower part; and bonding the $2^{nd}$ current-spreading electric-conducting layer of the $1^{st}$ substage LED in the upper part to the $2^{nd}$ current-spreading electric-conducting layer of the $2^{nd}$ substage LED in the lower part using a non-electrically-conductive bonding material, thereby forming a non-conductive bonding layer;

11) bonding the $2^{nd}$ substage LED of the lower part and the $2^{nd}$ substage LED of the upper part by: connecting the $1^{st}$ electrode of the $2^{nd}$ substage LED in the lower part to the $2^{nd}$ electrode of the $2^{nd}$ substage LED in the upper part using a metal bonding material; bonding the $2^{nd}$ current-spreading electric-conducting layer of the $2^{nd}$ substage LED in the lower part to the $2^{nd}$ current-spreading electric-conducting layer of the $2^{nd}$ substage LED in the upper part using a non-electrically-conductive bonding material, thereby forming a non-conductive bonding layer; and successively connecting the remaining substage LEDs in such a manner till the $n^{th}$ substage LED in the upper part and the $n^{th}$ substage LED in the lower part;

12) bonding the $n^{th}$ substage LED in the upper part to the $n+1^{th}$ substage LED in the lower part; conductively connecting the $1^{st}$ electrode of the $n^{th}$ substage LED in the upper part to the $2^{nd}$ electrode of the $n+1^{th}$ substage LED in the lower part; and bonding the $2^{nd}$ current-spreading electric-conducting layer of the $n^{th}$ substage LED in the upper part to the $2^{nd}$ current-spreading electric-conducting layer of the $n+1^{th}$ substage LED in the lower part using a non-electrically-conductive bonding material, thereby forming a non-conductive bonding layer;

13) providing the $1^{st}$ electrode of the $n+1^{th}$ substage LED in the lower part and the $2^{nd}$ electrode of the $1^{st}$ substage LED in the lower part as soldering-station electrodes; and 14) removing the epitaxial base of the substage LEDs in the upper part; and cutting the epitaxial base of the substage LEDs in the lower part by means of backside dicing, thereby forming the HV-LED module.

Further, n represents a number of LEDs connected in series and is an integer ranging from 1 to 110. The exact number of LEDs connected in series depends on practical needs. When designed for household lamp applications that generally consume 220V power, the HV-LED module requires fewer accessories such as an adapter and wiring, thereby significantly reducing costs at the packaging level and at the user level.

Further, the non-conductive bonding layers between the substage LEDs in the upper part and the substage LEDs in the lower part have a thickness $D=(2n+1)\lambda/4$, where n is an integer, and $\lambda$ is an emission wavelength. The thickness of the non-conductive bonding layer provides enhanced transmission, thereby preventing total emission of light at the binding interface between substage LEDs in the upper part and the substage LEDs in the lower part, and in turn improving light extraction efficiency of the HV-LED module having the 3D light-emitting structure.

Further, the active layer in each of the substage LEDs may be made of GaN, GaInN, AlGaN, AlGaInN, AlN, AlGaInP, GaInP, GaAs, AlGaAs, GaInAs, AlGaInAs, or GaInAsP III-V compound. The current-spreading electric-conducting layer may be made of indium tin oxide (ITO), ZnO, or graphene.

Further, each of the substage LEDs in the upper part and its vertically adjacent substage LED in the lower part jointly present two pairs of parallel epitaxial insulating layers. Two of these epitaxial insulating layers are coincide with each other in the vertical direction, and the other two epitaxial insulating layers are staggered. This simplifies cutting process of the HV-LED module and helps improve the yield.

According to the foregoing scheme, the present invention has at least two stacked parts of substage LEDs that each have independent light-emitting structure and are bonded in a staggered pattern, and the substage LEDs are connected in series to form the 3D light-emitting structure, thereby significantly increasing light-emitting power per unit area, downsizing a high-voltage chip module using it by nearly two times, and effectively reducing packaging costs for the HV-LED module.

DETAILED DESCRIPTION OF THE INVENTION

Figure 8:
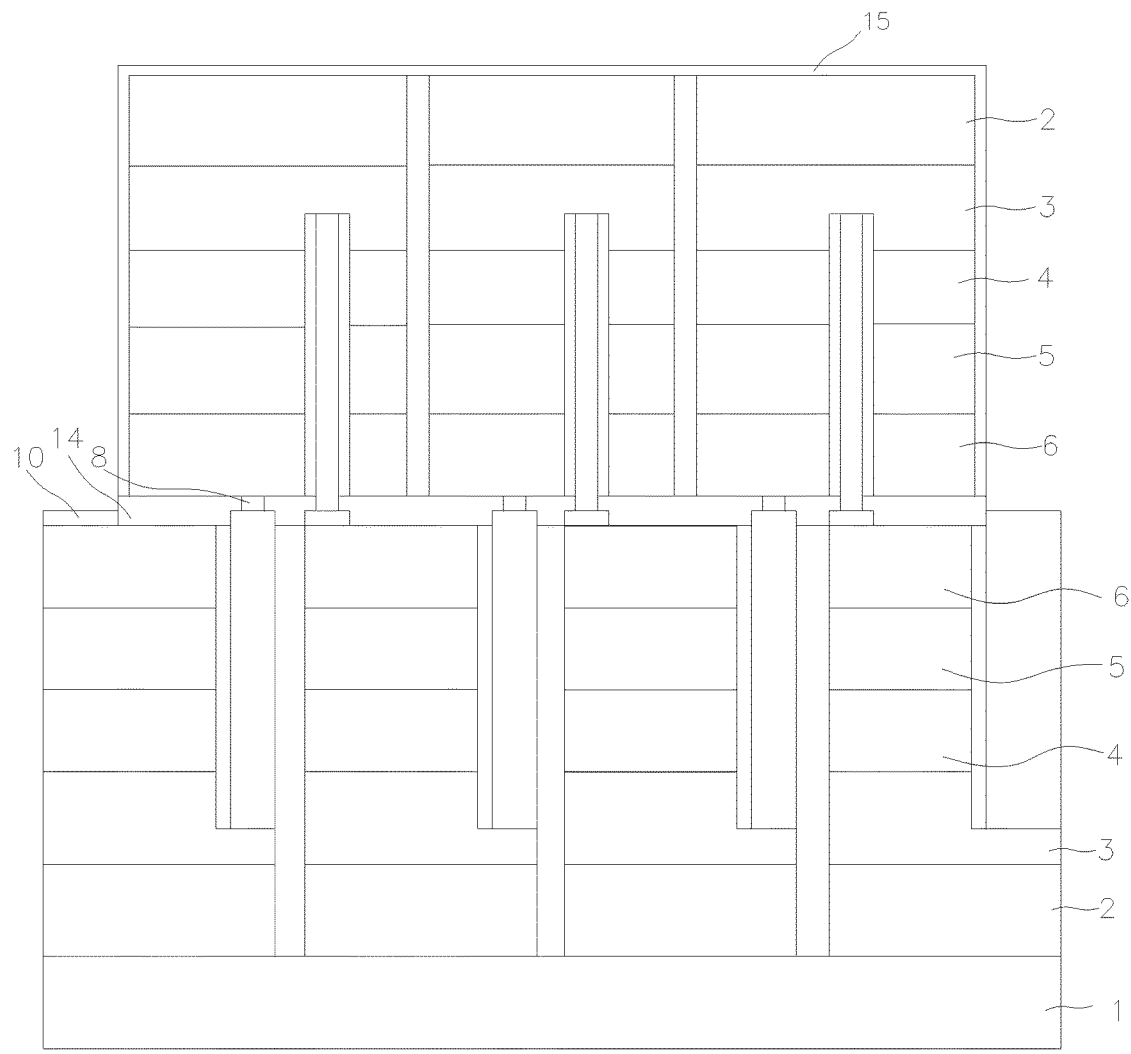
FIG. 8, according to the first embodiment of the present invention, shows the resultant HV-LED module after removal of the epitaxial base.

The invention as well as a preferred mode of use, further objectives and advantages thereof will be best understood by reference to the following detailed description of illustrative embodiments when read in conjunction with the accompanying drawings First Embodiment An HV-LED module having a 3D light-emitting structure is composed of seven substage LEDs that each have an independent light-emitting structure and are connected in series. The serially connected substage LEDs form two stacked parts, namely a lower part including four bottom-layer substage LED and an upper part including three top-layer substage LED, as shown in FIG. 8.

Each of the substage LEDs has an independent active layer 4. The active layer 4 has a first contact surface on which a first-type electric-conducting layer 3 is provided. The active layer 4 also has a $2^{nd}$ contact surface on which a second-type electric-conducting layer 5 is provided. The first-type electric-conducting layer 3 is made of Si-doped GaN III-V compound, and has a thickness of 2 μm. The active layer 4 is of a structure where six pairs of quantum wells and quantum barriers grow alternately. Therein, the quantum barriers are GaN III-V compound, with a thickness of 10 nm, and the quantum wells are GaInN III-V compound, with a thickness of 3 nm. The second-type electric-conducting layer 5 is made of Mg-doped GaN III-V compound, with a thickness of 300 nm.

The $1^{st}$, $2^{nd}$, $3^{rd}$ and $4^{th}$ substage LEDs in the lower part each have a substrate on which a first-type electric-conducting layer 3 is provided. The substrate includes an epitaxial base 1 and a buffering layer 2 provided on the epitaxial base 1. A $1^{st}$ electrode is provided on the first-type electric-conducting layer 3. A $2^{nd}$ current-spreading electric-conducting layer 6 is provided on a second-type electric-conducting layer 5. A $2^{nd}$ electrode 10 is provided on the $2^{nd}$ current-spreading electric-conducting layer 6. The $1^{st}$ electrode 8 and the $2^{nd}$ electrode 10 are at the same side. The current-spreading electric-conducting layer is made by means of evaporation process using ITO, so it is an ITO electric-conducting layer.

The $1^{st}$, $2^{nd}$, $3^{rd}$ and $4^{th}$ substage LEDs in the upper part each have a first-type electric-conducting layer 3 on which a $1^{st}$ electrode 8 is provided. A $2^{nd}$ current-spreading electric-conducting layer 6 is provided on a second-type electric-conducting layer 5. A $2^{nd}$ electrode 10 is provided on the $2^{nd}$ current-spreading electric-conducting layer 6. The $1^{st}$ electrode 8 and the $2^{nd}$ electrode 10 are at the same side. The current-spreading electric-conducting layer is made by means of evaporation process using ITO, so it is an ITO electric-conducting layer.

Between a contact surface of the $1^{st}$ substage LED in the upper part and contact surfaces of the $1^{st}$ and $2^{nd}$ substage LEDs in the lower part, a non-conductive bonding layer is provided. Between a contact surface of the $2^{nd}$ substage LED in the upper part and contact surfaces of the $2^{nd}$ and $3^{rd}$ substage LEDs in the lower part, a non-conductive bonding layer is provided. Between a contact surface of the $3^{rd}$ substage LED in the upper part and contact surfaces of the $3^{rd}$ and $4^{th}$ substage LEDs in the lower part, a non-conductive bonding layer is provided. The non-conductive bonding layers have a first contact surface contacting the $2^{nd}$ current-spreading electric-conducting layers 6 of the $1^{st}$, $2^{nd}$ and $3^{rd}$ substage LED in the upper part, and have a $2^{nd}$ contact surface contacting the $2^{nd}$ current-spreading electric-conducting layers 6 of the $1^{st}$, $2^{nd}$, $3^{rd}$ and $4^{th}$ substage LEDs in the lower part.

The $1^{st}$ electrode 8 of the $1^{st}$ substage LED in the lower part and the $2^{nd}$ electrode 10 of the $1^{st}$ substage LED in the upper part are in metal connection.

The $1^{st}$ electrode 8 of the $1^{st}$ substage LED in the upper part and the $2^{nd}$ electrode 10 of the $2^{nd}$ substage LED in the lower part are in metal connection.

The $1^{st}$ electrode 8 of the $2^{nd}$ substage LED in the lower part and the $2^{nd}$ electrode 10 of the $2^{nd}$ substage LED in the upper part are in metal connection. The remaining electrodes are such connected successively till the $3^{rd}$ substage LEDs of the upper part and of the lower part.

The $1^{st}$ electrode 8 of the $3^{rd}$ substage LED in the upper part and the $2^{nd}$ electrode 10 of the $4^{th}$ substage LED in the lower part are in metal connection.

The $1^{st}$ electrode 8 of the $4^{th}$ substage LED in the lower part and the $2^{nd}$ electrode 10 of the $1^{st}$ substage LED in the lower part are soldering-station electrodes.

A method for manufacturing an HV-LED module having 3D light-emitting structure includes steps described below.

Figure 1:
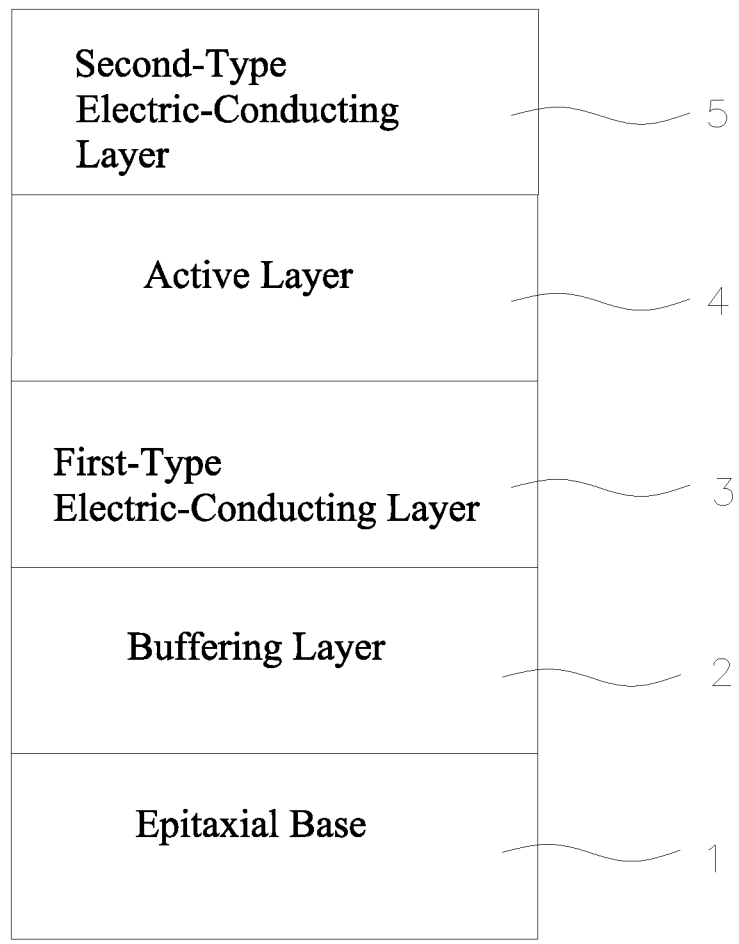
FIG. 1 is a schematic diagram illustrating an epitaxial structure according to a first embodiment of the present invention.

1) As shown in FIG. 1, on an upper surface of an epitaxial base 1, an epitaxial buffering layer 2, a first-type electric-conducting layer 3, an active layer 4 and second-type electric-conducting layer 5 are successively built from bottom to top.

More particularly, the epitaxial base 1 is a piece of 4" sapphire having a thickness of 400 μm. The buffering layer 2 is made of an undoped GaN III-V compound and has a thickness of 2 μm.

2) Then substage LEDs of a lower part are made. On the surface of a second-type electric-conducting layer 5, an ITO material is deposited through evaporation, so as to form a $2^{nd}$ current-spreading electric-conducting layer 6.

Figure 2:
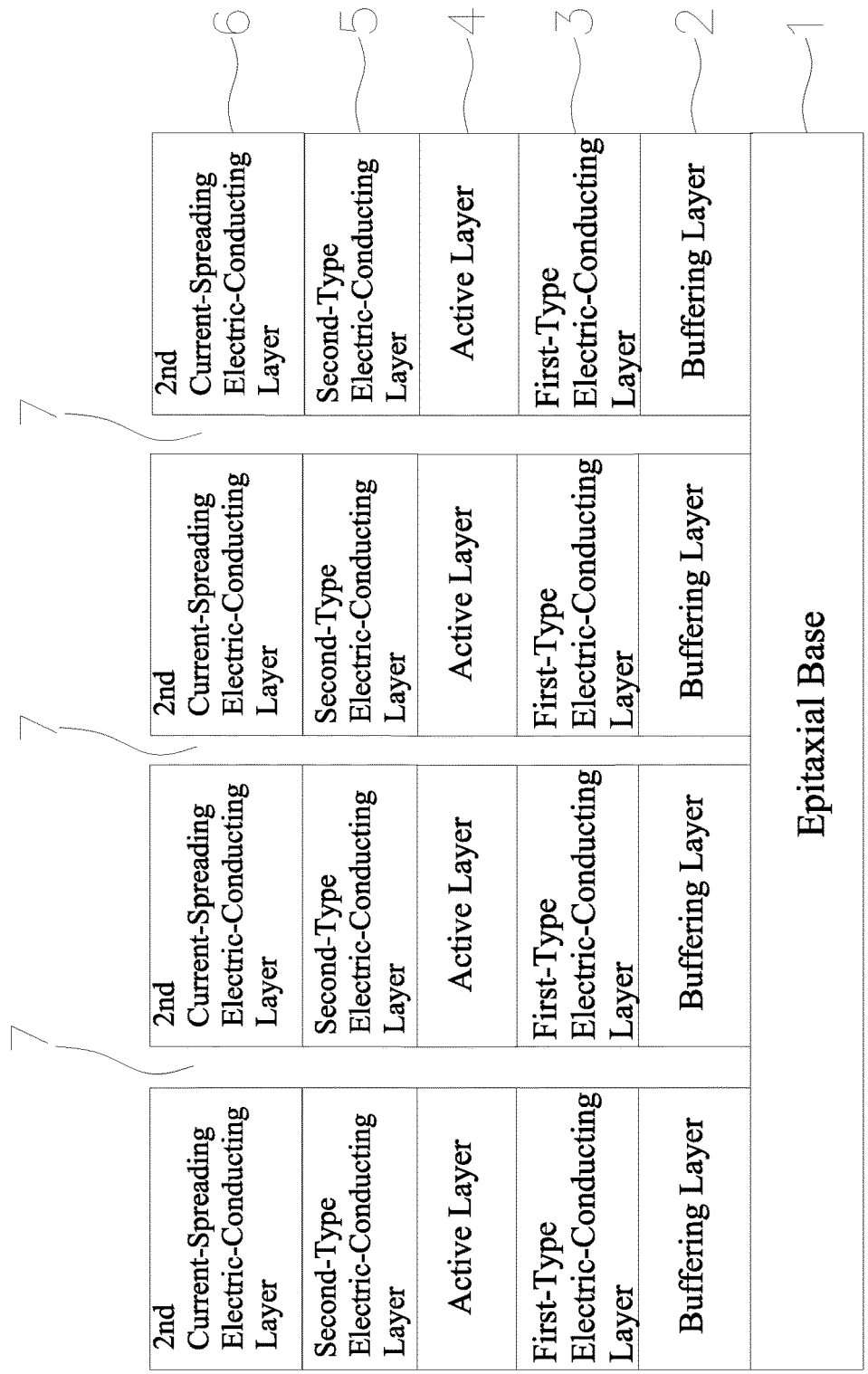
FIG. 2 is a schematic diagram illustrating the first embodiment of the present invention, showing separating troughs between substage LEDs.

3) As shown in FIG. 2, epitaxial separating troughs 7 are formed at the surface of the $2^{nd}$ current-spreading electric-conducting layer 6 by means of masking and ICP etching. The epitaxial separating trough 7 has a width along the cutting edge of the substage LEDs being 20 μm, and 4 μm for the non-cutting edge of the substage LEDs. The etching is done to the epitaxial base 1, thereby forming tens of thousands of independent, epitaxial light-emitting structures with a size of 10 mil*10 mil.

Figure 3:
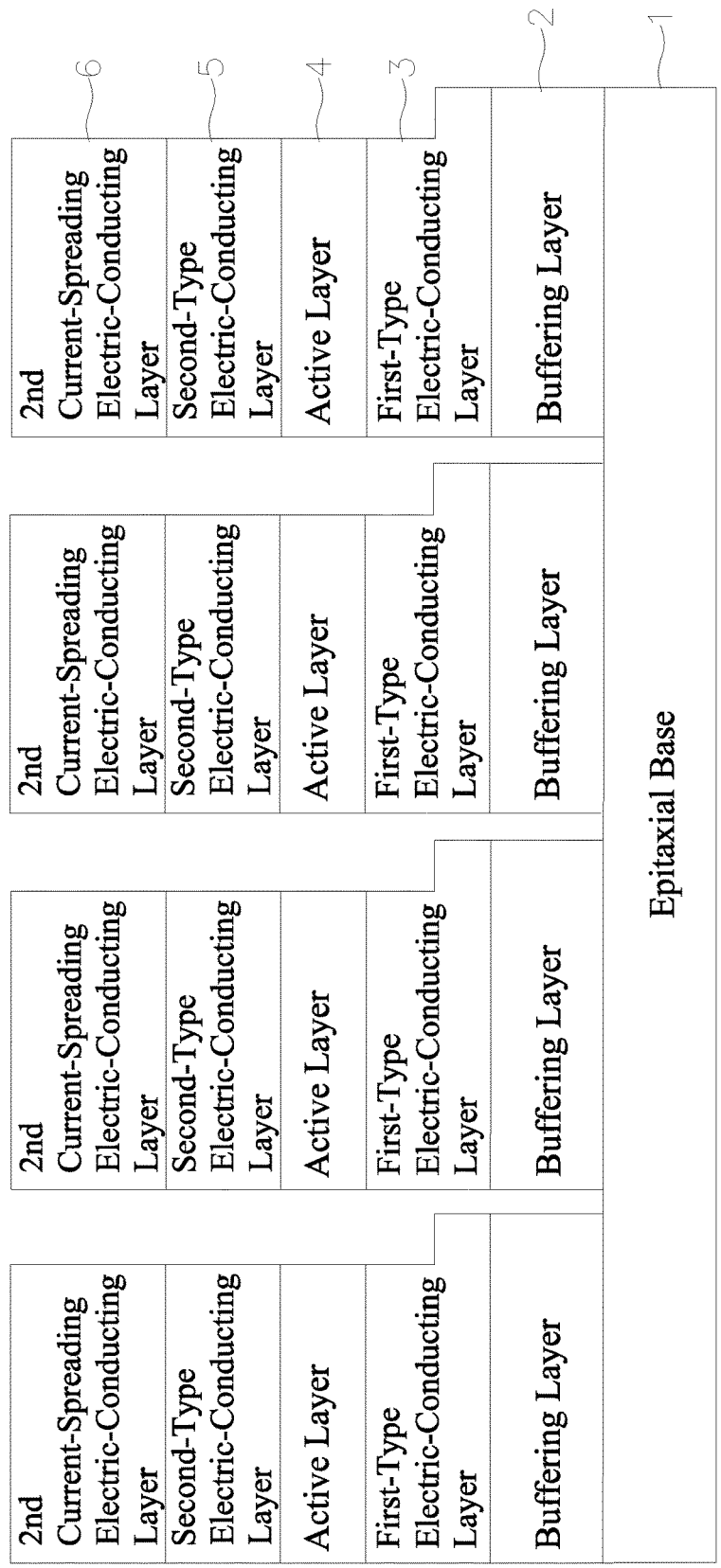
FIG. 3, according to the first embodiment of the present invention, illustrates locations of electrodes on the substage LEDs.

4) As shown in FIG. 3, $1^{st}$ electrode-making areas are made at the surface of the $2^{nd}$ current-spreading electric-conducting layer 6 by means of masking and ICP etching, with the etching done to the first-type electric-conducting layer 3.

Figure 4:
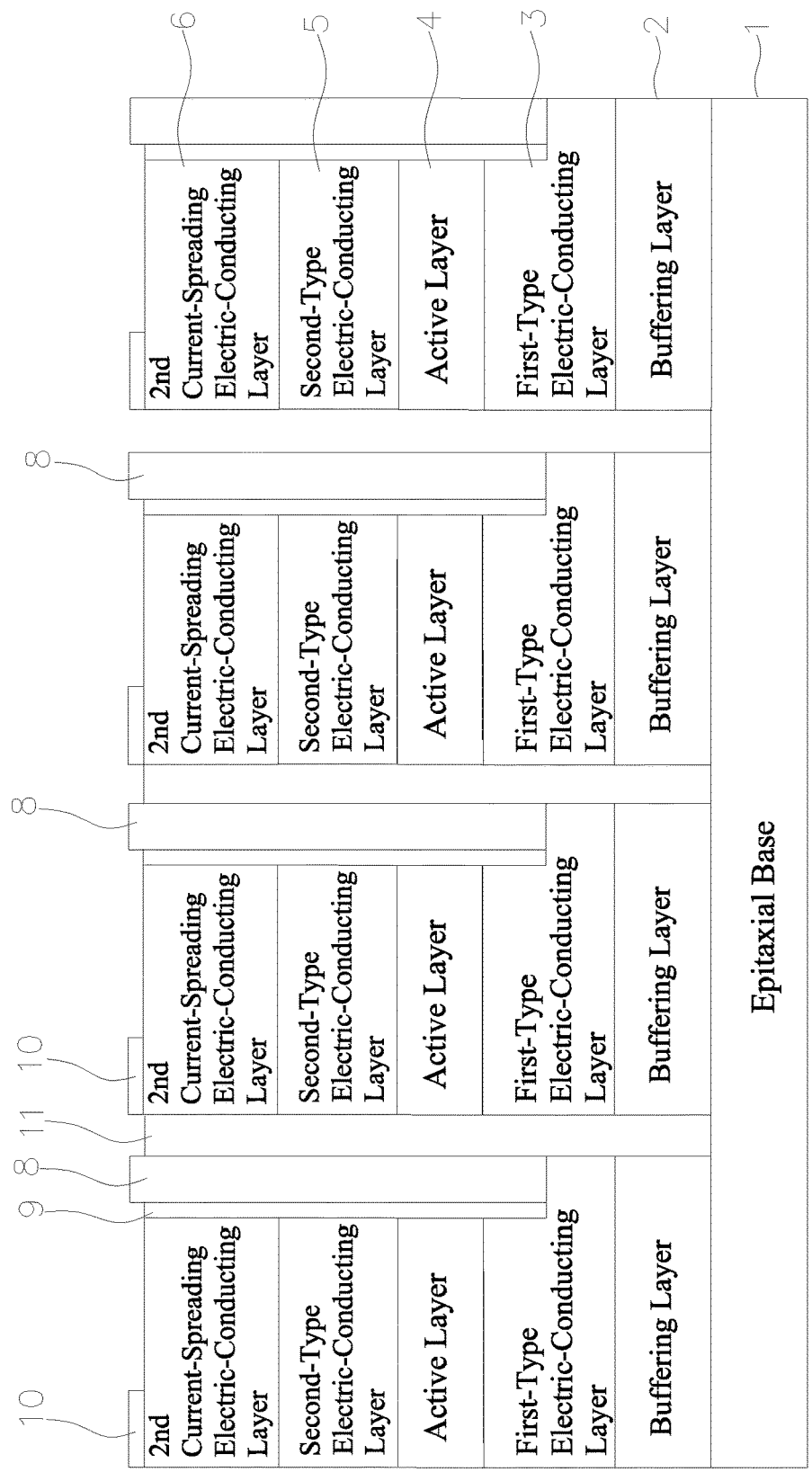
FIG. 4, according to the first embodiment of the present invention, illustrates formation of $1^{st}$ electrodes, $2^{nd}$ electrodes and epitaxial insulating layers of the substage LEDs.

5) $1^{st}$ electrodes 8 are formed in the $1^{st}$ electrode-making areas in the first-type electric-conducting layer 3. The $1^{st}$ electrode 8 and the corresponding epitaxial light-emitting structure are separated by the electrode separating trough, as shown in FIG. 4.

6) $2^{nd}$ electrodes 10 are formed on the $2^{nd}$ current-spreading electric-conducting layer 6 so that the $1^{st}$ electrodes 8 and the $2^{nd}$ electrodes 10 are at the same side and with their surfaces coplanar.

Figure 5:
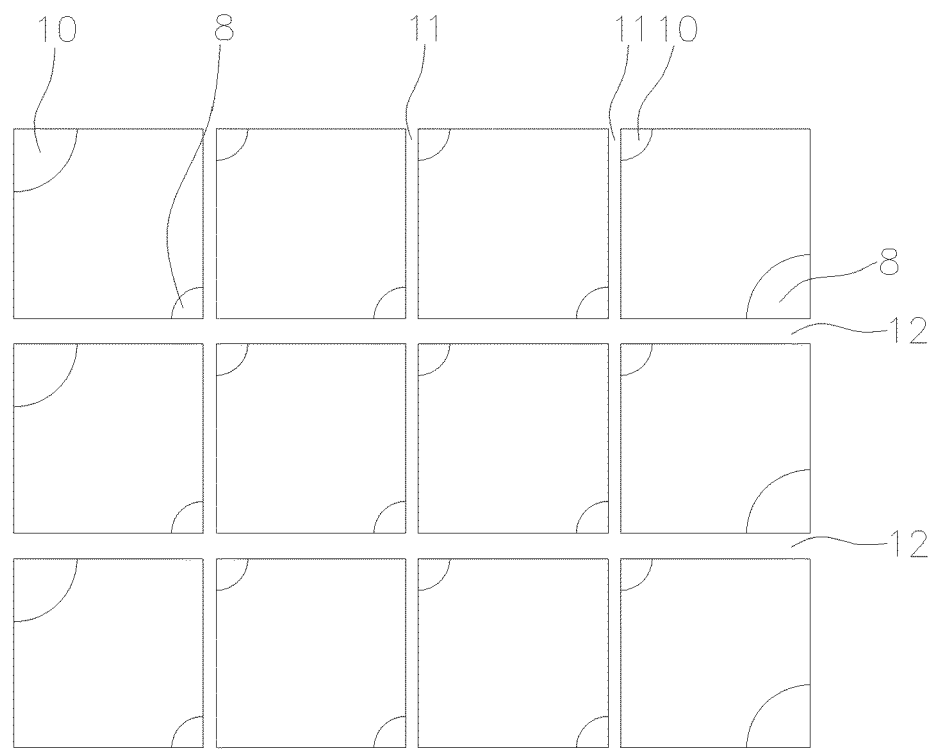
FIG. 5 is a plane view according to the first embodiment of the present invention showing the $1^{st}$ electrodes, $2^{nd}$ electrodes and epitaxial insulating layer of the substage LEDs in the lower part.

7) The epitaxial separating troughs and the electrode separating troughs are filled with an insulating material by means of evaporation process so as to form epitaxial insulating layers 11 and electrode insulating layers 9. The epitaxial separating troughs around the substage LEDs in the lower part that will be later used as cutting streets 12 for the resultant HV-LED module are left unfilled. Thereby, the substage LEDs for the lower part are formed, as shown in FIG. 4 and FIG. 5.

Figure 6:
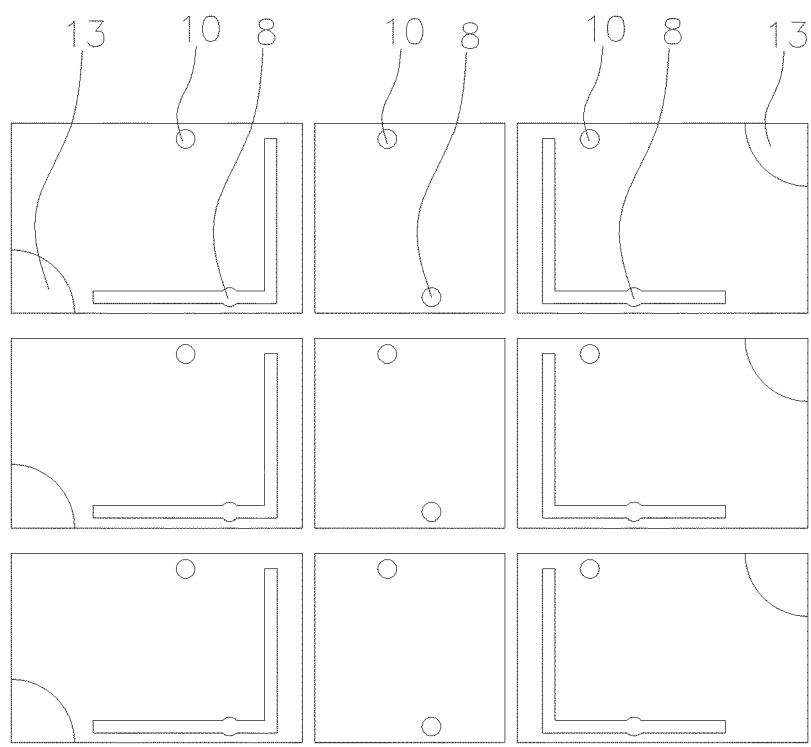
FIG. 6 is a plane view according to the first embodiment of the present invention showing the $1^{st}$ electrodes, $2^{nd}$ electrodes and epitaxial insulating layer of the substage LEDs in the upper part.

8) The substage LEDs for the upper part are made similarly except that bare electrode 13 for the $1^{st}$ and $3^{rd}$ substage LEDs in the upper part are additionally made in Step 4 and that the chip size and electrode diagram of the are substage LEDs are different from those for the lower part. As shown in FIG. 6, tens of thousands of independent, epitaxial light-emitting structures arranged in a cyclic alternating pattern of 10 mil*15 mil/10 mil*10 mil/10 mil*15 mil are formed. Since the substage LEDs of the lower and upper parts follow different designs, when connected in series, the two parts of substage LEDs can coincide with each other in terms of light-emitting area and space.

9) The $1^{st}$ substage LED of the lower part and the $1^{st}$ substage LED of the upper part are bonded in the following manner. The $1^{st}$ electrode 8 of the $1^{st}$ substage LED in the lower part and the $2^{nd}$ electrode 10 of the $1^{st}$ substage LED in the upper part are connected using a metal bonding material. The $2^{nd}$ current-spreading electric-conducting layer 6 of the $1^{st}$ substage LED in the lower part and the $2^{nd}$ current-spreading electric-conducting layer 6 of the $1^{st}$ substage LED in the upper part are bonded using a non-electrically-conductive bonding material, thereby forming a non-conductive bonding layer 14.

10) The $1^{st}$ substage LED of the upper part and the $2^{nd}$ substage LED of the lower part are bonded in the following manner. The $1^{st}$ electrode 8 of the $1^{st}$ substage LED in the upper part and the $2^{nd}$ electrode 10 of the $2^{nd}$ substage LED in the lower part are connected using a metal bonding material. The $2^{nd}$ current-spreading electric-conducting layer 6 of the $1^{st}$ substage LED in the upper part and the $2^{nd}$ current-spreading electric-conducting layer 6 of the $2^{nd}$ substage LED in the lower part are bonded using a non-electrically-conductive bonding material, thereby forming a non-conductive bonding layer 14.

11) The $2^{nd}$ substage LED of the lower part and the $2^{nd}$ substage LED of the upper part are bonded in the following manner. The $1^{st}$ electrode 8 of the $2^{nd}$ substage LED in the lower part and the $2^{nd}$ electrode 10 of the $2^{nd}$ substage LED in the upper part are connected using a metal bonding material. The $2^{nd}$ current-spreading electric-conducting layer 6 of the $2^{nd}$ substage LED in the lower part and the $2^{nd}$ current-spreading electric-conducting layer 6 of the $2^{nd}$ substage LED in the upper part are bonded using a non-electrically-conductive bonding material, thereby forming a non-conductive bonding layer 14. The substage LEDs are such connected successively till the $3^{rd}$ substage LEDs in the upper part and in the lower part.

12) The $3^{rd}$ substage LED of the upper part and the $4^{th}$ substage LED of the lower part are bonded in the following manner. The $1^{st}$ electrode 8 of the $3^{rd}$ substage LED in the upper part and the $2^{nd}$ electrode 10 of the $4^{th}$ substage LED in the lower part are connected using a metal bonding material. The $2^{nd}$ current-spreading electric-conducting layer 6 of the $3^{rd}$ substage LED in the upper part and the $2^{nd}$ current-spreading electric-conducting layer 6 of the $4^{th}$ substage LED in the lower part are bonded using a non-electrically-conductive bonding material, thereby forming a non-conductive bonding layer 14.

Figure 7:
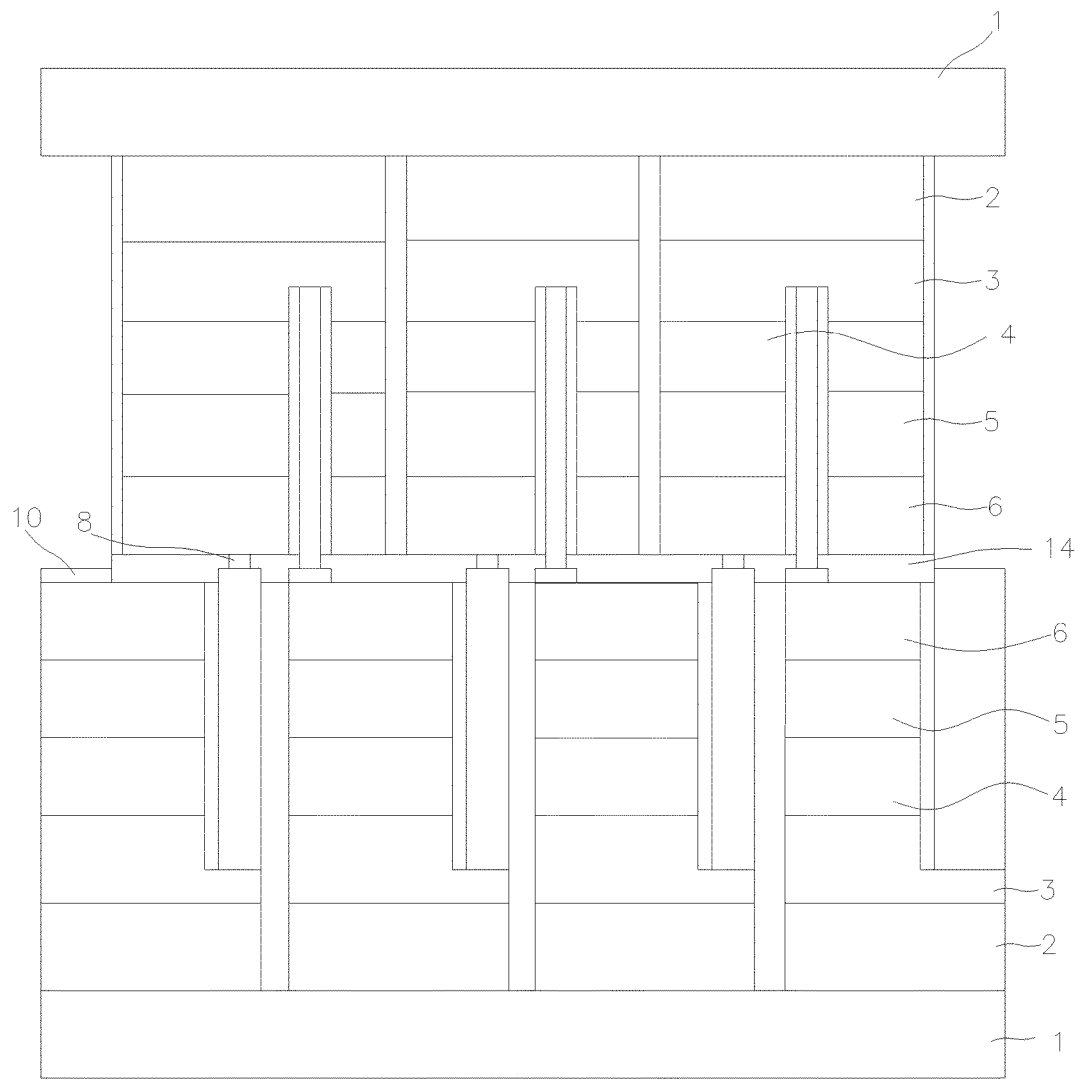
FIG. 7, according to the first embodiment of the present invention, shows the substage LEDs in the lower part and the substage LEDs in the upper part bonded together.

13) The $1^{st}$ electrode 8 of the $4^{th}$ substage LED in the lower part and the $2^{nd}$ electrode 10 of the $1^{st}$ substage LED in the lower part are soldering-station electrode, as shown in FIG. 7.

14) The sapphire epitaxial base 1 shared by the substage LEDs in the upper part are removed using laser ablation. The epitaxial structure is protected by a PV protective layer 15 made of silicon nitride by means of evaporation process, as shown in FIG. 8. At last, the epitaxial base 1 is cut by means of backside dicing, so as to form the HV-LED module.

What is claimed is:

1. An HV-LED (high-voltage light-emitting diode) module having a 3D light-emitting structure, being characterized in comprising at least two stacked parts of substage LEDs that are staggered and bonded to each other, wherein one of the parts defined as a lower part includes n+1 substage LEDs that are coplanar and are disposed on one or more substrates, and the other part defined as an upper part includes n substage LEDs that are coplanar and are disposed on top of the substage LEDs of the lower part, so that the adjacent substage LEDs in the lower part and in the upper are located in different planes, in which each said substage LED has an independent light-emitting structure and all of the substage LEDs are connected in series;

each said substage LED having an independent, epitaxial light-emitting structure, each two said adjacent independent, epitaxial light-emitting structures being separated by an epitaxial insulating layer; the epitaxial light-emitting structure including an active layer that has a first contact surface on which a first-type electrically-conducting layer is provided, and has a second contact surface on which a second-type electrically-conducting layer is provided;

each said substage LED in the lower part having the first-type electrically-conducting layer provided on the one or more substrates, a $1^{st}$ electrode of the substage LED in the lower part being provided on the first-type electrically-conducting layer, a current-spreading electrically-conducting layer being provided on the second-type electrically-conducting layer, and a $2^{nd}$ electrode of the substage LED in the lower part being provided on the current-spreading electrically-conducting layer of said substage LED in the lower part, wherein the $1^{st}$ electrode of the substage LED in the lower part and the $2^{nd}$ electrode of the substage LED in the lower part are at an identical side;

each said substage LED in the upper part having the first-type electrically-conducting layer provided with a $1^{st}$ electrode of the substage LED in the upper part, a current-spreading electrically-conducting layer being provided on the second-type electrically-conducting layer, and a $2^{nd}$ electrode of the substage LED in the upper part being provided on the current-spreading electrically-conducting layer of said substage LED in the upper part, wherein the $1^{st}$ electrode of the substage LED in the upper part and the $2^{nd}$ electrode of the substage LED in the upper part are at an identical side;

a non-conductive bonding layer being provided between adjacent contact surfaces of each said substage LED in the upper part and of each said substage LED in the lower part;

the $1^{st}$ electrode of the $1^{st}$ substage LED in the lower part and the $2^{nd}$ electrode of the $1^{st}$ substage LED in the upper part being directly and conductively connected to each other;

the $1^{st}$ electrode of the $1^{st}$ substage LED in the upper part and the $2^{nd}$ electrode of the $2^{nd}$ substage LED in the lower part being directly and conductively connected to each other; the $1^{st}$ electrode of the $2^{nd}$ substage LED in the lower part and the $2^{nd}$ electrode of the $2^{nd}$ substage LED in the upper part being directly and conductively connected to each other; and each of the remaining substage LEDs being successively connected to the successively-numbered substage LED in the opposite part; and the $1^{st}$ electrode of the $n^{th}$ substage LED in the upper part and the $2^{nd}$ electrode of the n+$1^{th}$ substage LED in the lower part being directly and conductively connected to each other; and the $1^{st}$ electrode of the n+$1^{th}$ substage LED in the lower part and the $2^{nd}$ electrode of the $1^{st}$ substage LED in the lower part acting as soldering-station electrodes.

2. The HV-LED module of claim 1, wherein the n+1 substage LEDs of the lower part and n substage LEDs of the upper part form a group of 2n+1 LEDs connected in series, and 2n+1 is an integer ranging from 1 to 110.

3. The HV-LED module of claim 1, being characterized in that the non-conductive bonding layers between the substage LEDs in the upper part and the substage LEDs in the lower part have a thickness of $D=(2n+1)\lambda/4$, where n is an integer, and $\lambda$, represents an emission wavelength.

4. The HV-LED module of claim 1, being characterized in that the active layer of each said substage LED is made of GaN, GaInN, AlGaN, AlGaInN, AlN, AlGaInP, GaInP, GaAs, AlGaAs, GaInAs, AlGaInAs, or GaInAsP III-V compound.

5. The HV-LED module of claim 1, being characterized in that the current-spreading electrically-conducting layer is made of ITO, ZnO, or graphene.

6. The HV-LED module of claim 1, wherein the active layer of each said substage LED includes pairs of quantum wells and quantum barriers disposed alternatively.

7. The HV-LED module of claim 1, wherein light-emitting areas of the substage LEDs in the upper part coincide with light-emitting areas of the substage LEDs in the lower part.

8. The HV-LED module of claim 1, further comprising a protective layer covering the epitaxial light-emitting structures of the substage LEDs in the upper part.

9. The HV-LED module of claim 1, wherein the substage LEDs in the upper part are insulated from each other by a plurality of epitaxial insulating layers.

10. The HV-LED module of claim 1, wherein the substage LEDs in the lower part are insulated from each other by a plurality of epitaxial insulating layers.

11. The HV-LED module of claim 1, wherein the $1^{st}$ electrode of each said substage LED in the lower part or the upper part are insulated from the active layer, the second-type electrically-conducting layer, and the current-spreading electrically-conducting layer of said substage LED by an electrode insulating layer.

12. The HV-LED module of claim 1, wherein at least one of the substage LEDs in the lower part includes a bare electrode.

13. The HV-LED module of claim 1, wherein the epitaxial light-emitting structures of the substage LEDs in the upper part or the lower part have sizes or shapes that are arranged in a cyclic alternating pattern.

14. The HV-LED module of claim 1, wherein the substage LEDs in the upper part have chip sizes or electrode patterns that are different from chip sizes or electrode patterns of the substage LEDs in the lower part.

15. The HV-LED module of claim 1, wherein for each said substage LED in the upper part, the $1^{st}$ electrode of said substage LED in the upper part is in direct contact with the $2^{nd}$ electrode of an adjacent substage LED in the lower part, and the $2^{nd}$ electrode of said substage LED in the upper part is in direct contact with the $1^{st}$ electrode of another adjacent substage LED in the lower part.

* * * * *